United States Patent
Lee et al.

(10) Patent No.: US 10,026,550 B2
(45) Date of Patent: Jul. 17, 2018

(54) MULTILAYER CERAMIC CAPACITOR AND BOARD HAVING THE SAME

(71) Applicant: SAMSUNG ELECTRO-MECHANICS CO., LTD., Suwon-Si, Gyeonggi-Do (KR)

(72) Inventors: Kyo Kwang Lee, Suwon-si (KR); Chang Sub Kum, Suwon-si (KR); Jin Kim, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 163 days.

(21) Appl. No.: 15/055,165

(22) Filed: Feb. 26, 2016

(65) Prior Publication Data

US 2017/0062129 A1   Mar. 2, 2017

(30) Foreign Application Priority Data

Aug. 31, 2015  (KR) .......................... 10-2015-0123091

(51) Int. Cl.
*H01G 4/30* (2006.01)
*H01G 2/06* (2006.01)
(Continued)

(52) U.S. Cl.
CPC ........... *H01G 2/065* (2013.01); *H01G 4/0085* (2013.01); *H01G 4/1227* (2013.01); *H01G 4/232* (2013.01);
(Continued)

(58) Field of Classification Search
CPC ........... H01G 4/30; H01G 4/012; H01G 4/32; H01G 4/228; H01G 4/1227; H01G 4/005; H01G 4/248
See application file for complete search history.

(56) References Cited

U.S. PATENT DOCUMENTS

| 7,936,554 | B2 * | 5/2011 | Itamura | .................. | H01G 4/228 361/303 |
| 8,315,033 | B2 * | 11/2012 | Takashima | ............. | H01G 4/012 361/303 |

(Continued)

FOREIGN PATENT DOCUMENTS

| JP | 2011-097091 A | 5/2011 |
| JP | 2014-132631 A | 7/2014 |
| KR | 10-2010-0068056 A | 6/2010 |

*Primary Examiner* — Nguyen Ha
(74) *Attorney, Agent, or Firm* — McDermott Will & Emery LLP

(57) ABSTRACT

A multilayer ceramic capacitor includes a ceramic body including a dielectric layer and first and second internal electrodes alternately disposed with the dielectric layer interposed therebetween. The first internal electrode includes a first electrode plate and a first lead portion exposed to an external surface of the ceramic body and the second internal electrode includes a second electrode plate and a second lead portion exposed to an external surface of the ceramic body. The relationship Mb>Mt may be satisfied, where Mb is a length of the first and second lead portions extending from the first and second electrode plates to a mounting surface of the ceramic body to which the first and second lead portions are exposed and Mt is a length from the first and second electrode plates to a surface of the ceramic body opposing the mounting surface.

19 Claims, 6 Drawing Sheets

(51) Int. Cl.
*H01G 4/008* (2006.01)
*H01G 4/12* (2006.01)
*H01G 4/232* (2006.01)
*H05K 3/34* (2006.01)

(52) U.S. Cl.
CPC ............ *H01G 4/30* (2013.01); *H05K 3/3436* (2013.01); *H05K 2201/10015* (2013.01); *H05K 2201/10636* (2013.01); *Y02P 70/611* (2015.11)

(56) References Cited

U.S. PATENT DOCUMENTS

| | | | |
|---|---|---|---|
| 9,336,950 B2 * | 5/2016 | Kim | H01G 4/012 |
| 9,653,212 B2 * | 5/2017 | Lee | H01G 4/30 |
| 9,773,619 B2 * | 9/2017 | Uno | H01G 4/30 |
| 2008/0186652 A1 * | 8/2008 | Lee | H01G 4/012 |
| | | | 361/306.3 |
| 2010/0149769 A1 | 6/2010 | Lee et al. | |
| 2014/0182910 A1 | 7/2014 | Ahn et al. | |

* cited by examiner

MULTILAYER CERAMIC CAPACITOR AND BOARD HAVING THE SAME

CROSS-REFERENCE TO RELATED APPLICATION

This application claims the benefit of priority to Korean Patent Application No. 10-2015-0123091, filed on Aug. 31, 2015 with the Korean Intellectual Property Office, the entirety of which is incorporated herein by reference.

TECHNICAL FIELD

The present disclosure relates to a multilayer ceramic capacitor (MLCC) and a board having the same.

BACKGROUND

MLCCs are commonly used as components in mobile communications devices such as portable computers, personal digital assistants (PDAs), and mobile phones due to inherent advantages thereof, such as compactness, guaranteed high capacitance, and ease of mountability.

Recently, as electronic products have been reduced in size and have had multifunctionality implemented therein, chip components have also become more compact and highly functional. Consequently, MLCCs, which are small but have high capacity, are in demand.

An MLCC has equivalent series resistance (ESR) and equivalent series inductance (ESL) properties, in addition to a capacitance property, and the ESR and ESL properties may impede the functionality of the bypass capacitor.

Thus, an MLCC having low ESL characteristics, while providing high capacitance, is required.

SUMMARY

An aspect of the present disclosure provides a multilayer ceramic capacitor having low ESL and high capacity, and a board having the same.

According to an aspect of the present disclosure, a multilayer ceramic capacitor comprises a ceramic body including a dielectric layer and first and second internal electrodes alternately disposed with the dielectric layer interposed therebetween. The first internal electrode includes a first electrode plate and a first lead portion exposed to an external surface of the ceramic body and the second internal electrode includes a second electrode plate and a second lead portion exposed to an external surface of the ceramic body. The relationship Mb>Mt may be satisfied, where Mb is a length of the first and second lead portions extending from the first and second electrode plates to a mounting surface of the ceramic body to which the first and second lead portions are exposed and Mt is a length from the first and second electrode plates to a surface of the ceramic body opposing the mounting surface.

The multilayer ceramic capacitor may satisfy the relationship $1.69 \leq Ts/(Mt+Mb) \leq 17.75$, where Ts is a length from the mounting surface of the ceramic body to the surface of the ceramic body opposing the mounting surface of the ceramic body.

The multilayer ceramic capacitor may further satisfy the relationship $0.0282 \leq Mb/Ts \leq 0.2958$, where Ts is the length from the mounting surface of the ceramic body to the surface of the ceramic body opposing the mounting surface of the ceramic body.

The first and second lead portions may be exposed to the same surface of the ceramic body, and the first and second internal electrodes may be stacked perpendicularly with respect to the mounting surface of the ceramic body.

The multilayer ceramic capacitor may further comprise first and second external electrodes disposed on the mounting surface of the ceramic body and electrically connected to the first and second lead portions, respectively.

The first and second external electrodes may extend to portions of first and second surfaces in the length direction of the ceramic body.

The first and second external electrodes may extend to portions of first and second surfaces in the width direction of the ceramic body.

According to another aspect of the present disclosure, a board having a multilayer ceramic capacitor comprises a multilayer ceramic capacitor including first and second external electrodes and a ceramic body including a dielectric layer and first and second internal electrodes alternately disposed with the dielectric layer interposed therebetween. The first internal electrode includes a first electrode plate and a first lead portion exposed to an external surface of the ceramic body and the second internal electrode includes a second electrode plate and a second lead portion exposed to an external surface of the ceramic body. The relationship Mb>Mt is satisfied, where Mb is a length of the first and second lead portions extending from the first and second electrode plates to a mounting surface of the ceramic body to which the first and second lead portions are exposed and Mt is a length from the first and second electrode plates to a surface of the ceramic body opposing the mounting surface of the ceramic body. A printed circuit board (PCB) including first and second board electrodes is connected to the first and second external electrodes, respectively.

According to another aspect of the present disclosure, a multilayer ceramic capacitor comprises: a ceramic body including a dielectric layer and first and second internal electrodes alternately disposed with the dielectric layer interposed therebetween. The first internal electrode includes a first electrode plate and a first lead portion exposed to an external surface of the ceramic body and the second internal electrode includes a second electrode plate and a second lead portion exposed to an external surface of the ceramic body. Mb is not equal to Mt, where Mb is a length of the first and second lead portions extending from the first and second electrode plates to a mounting surface of the ceramic body to which the first and second lead portions are exposed and Mt is a length from the first and second electrode plates to a surface of the ceramic body opposing the mounting surface.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
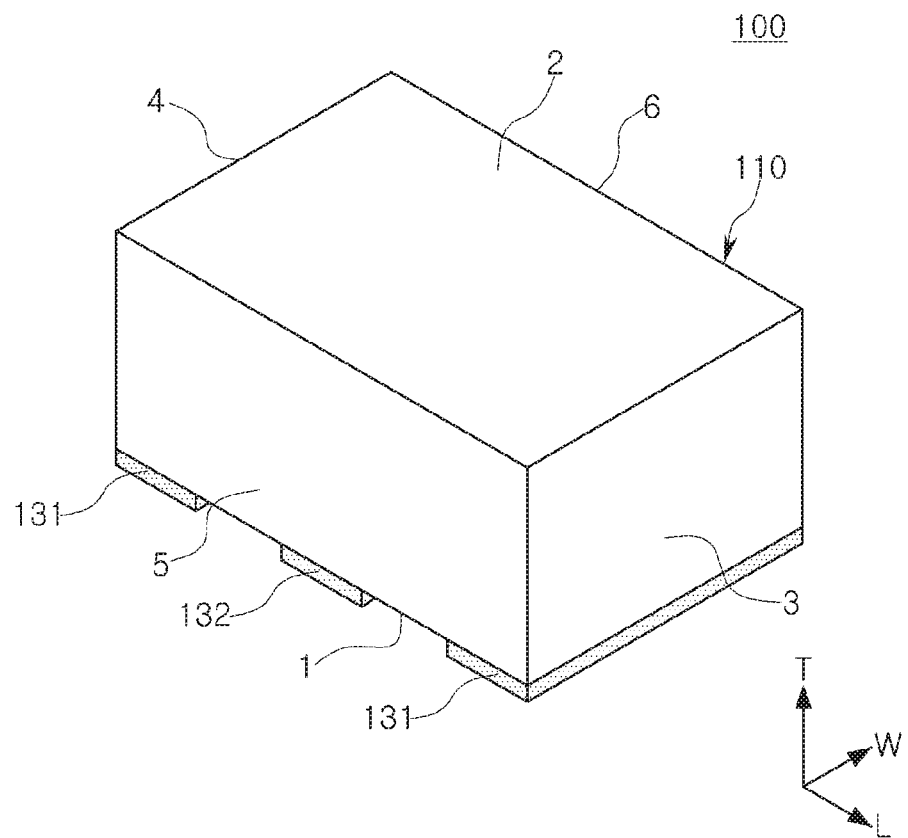
FIGS. 1A and 1B are perspective views of a multilayer ceramic capacitor (MLCC) according to an exemplary embodiment in the present disclosure.

Hereinafter, embodiments of the present inventive concept will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "upper," or "above" other elements would then be oriented "lower," or "below" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present inventive concept will be described with reference to schematic views illustrating embodiments of the present inventive concept. In the drawings, for example, due to manufacturing techniques and/or tolerances, modifications of the shape shown may be estimated. Thus, embodiments of the present inventive concept should not be construed as being limited to the particular shapes of regions shown herein, for example, to include a change in shape results in manufacturing. The following embodiments may also be constituted by one or a combination thereof.

The contents of the present inventive concept described below may have a variety of configurations and propose only a required configuration herein, but are not limited thereto.

Multilayer Ceramic Capacitor (MLCC)

Figure 1B:
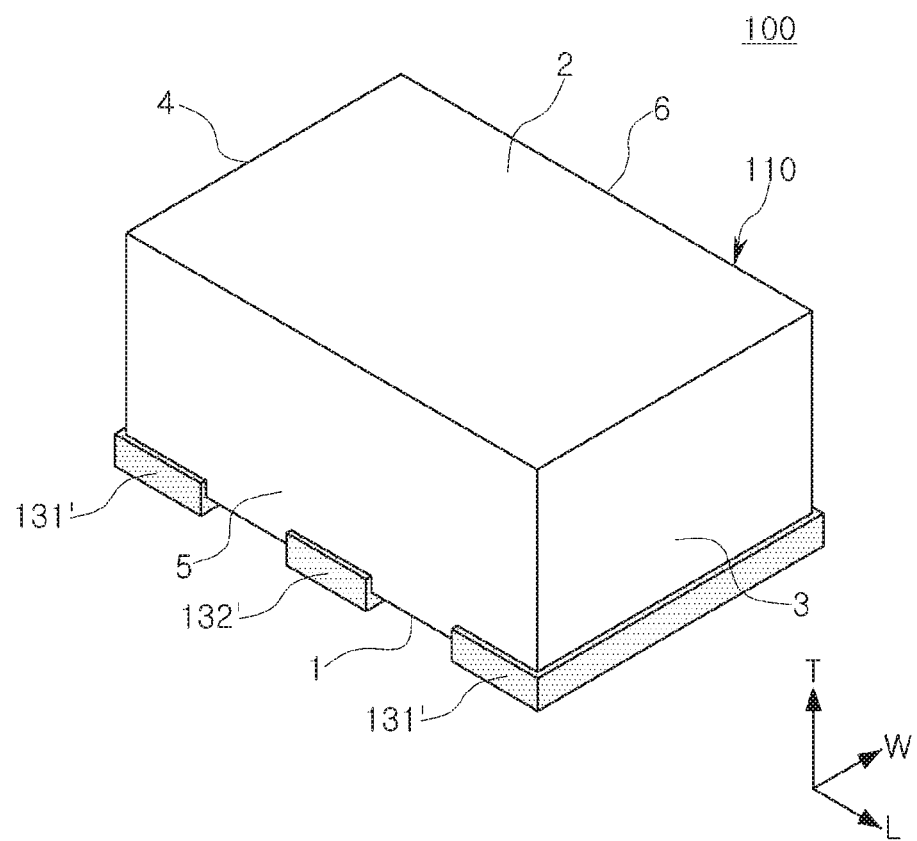
Figure 2:
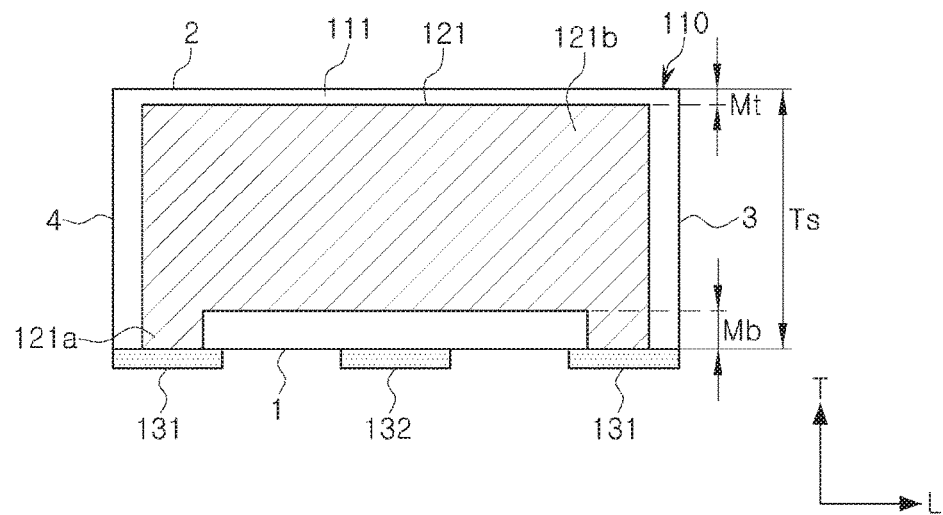
FIG. 2 is a cross-sectional view illustrating a first internal electrode of the MLCC of FIG. 1A, taken on a thickness-length plane.
Figure 3:
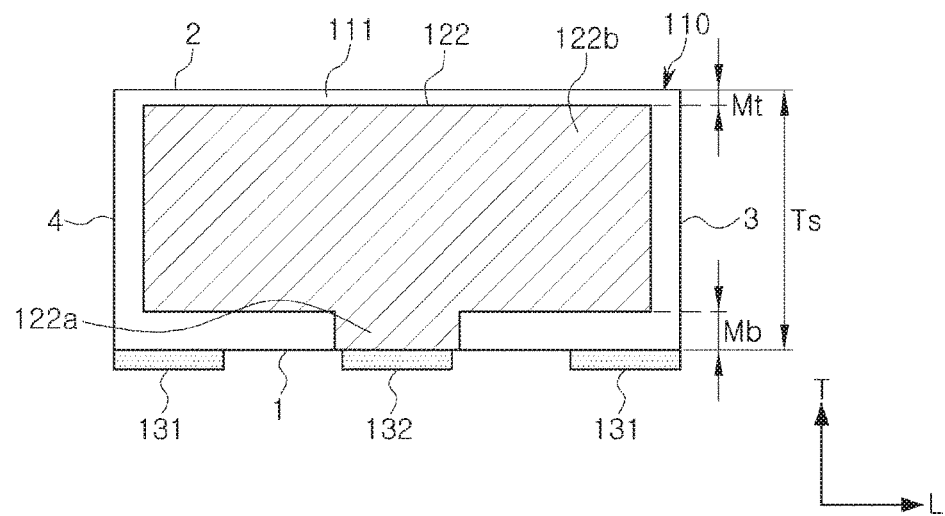
FIG. 3 is a cross-sectional view illustrating a second internal electrode of the MLCC of FIG. 1A, taken on a thickness-length plane.

FIGS. 1A and 1B are perspective views of a multilayer ceramic capacitor (MLCC) according to an exemplary embodiment in the present disclosure, FIG. 2 is a cross-sectional view illustrating a first internal electrode of the MLCC of FIG. 1A, taken on a thickness-length plane, and FIG. 3 is a cross-sectional view illustrating a second internal electrode of the MLCC of FIG. 1A, taken on a thickness-length plane.

Referring to FIGS. 1A through 3, an MLCC 100 according to an exemplary embodiment may include a ceramic body 110 including a dielectric layer 111 and first and second internal electrodes 121 and 122 disposed with the dielectric layer 111 interposed therebetween. The first internal electrode 121 includes a first electrode plate 121*b* and a first lead portion 121*a* exposed to an external surface of the ceramic body 110, and the second internal electrode 122 includes a second electrode plate 122*b* and a second lead portion 122*a* exposed to an external surface of the ceramic body 110.

Here, when lengths of the first lead portion 121*a* and the second lead portion 122*a* extending from the first and second electrode plates 121*b* and 122*b* to a surface of the ceramic body 110 to which the first lead portion 121*a* and the second lead portion 122*a* are exposed is Mb and a length from the first and second electrode plates 121*b* and 122*b* to a surface of the ceramic body 110 opposing the surface of the ceramic body 110 to which the first lead portion 121*a* and the second lead portion 122*a* are exposed is Mt, Mb>Mt is satisfied.

The ceramic body 110 may be formed by stacking a plurality of dielectric layers 111 and subsequently sintering the plurality of stacked dielectric layers 111.

Since the dielectric layers 111 are in a sintered state after stacked, adjacent dielectric layers 111 may be integrated with each other so that boundaries therebetween are not readily apparent without using a scanning electron microscope (SEM).

In an exemplary embodiment, the ceramic body 110 may have a hexahedral shape with six sides.

Here, the sides opposing each other in the thickness direction are defined as upper and lower surfaces 1 and 2, the sides opposing each other in the length direction are defined as first and second end surfaces 3 and 4, and the sides opposing each other in the width direction are defined as third and fourth side surfaces 5 and 6.

The dielectric layer 111 may contain a high-k ceramic material. For example, the dielectric layer 111 may contain barium titanate ($BaTiO_3$)-based ceramic powder, or the like. However, a material of the dielectric layer 111 is not limited thereto as long as sufficient capacitance can be obtained therewith.

Also, the dielectric layer 111 may further contain ceramic additives, organic solvents, plasticizers, binders, and dispersants in addition to the ceramic powder. Here, as the ceramic additives, various materials such as a transition metal oxide or carbide, rare earth elements, magnesium (Mg), or aluminum (Al) may be used.

The ceramic body 110 includes the first and second internal electrodes disposed with the dielectric layers 111 interposed therebetween.

The first and second internal electrodes 121 and 122 may be formed by printing conductive paste containing a conductive metal on at least one surface of a ceramic sheet forming the dielectric layer 111.

The conductive metal of the conductive paste may be one of silver (Ag), palladium (Pd), platinum (Pt), nickel (Ni), and copper (Cu), or alloys thereof.

As a printing method of the conductive paste, a screen printing method or a gravure printing method may be used.

The first and second internal electrodes 121 and 122 serve to forma capacitance forming region within the MLCC 100.

The first and second internal electrodes 121 and 122 may be classified into the first and second electrode plates 121b and 122b and the first lead portion 121a and the second lead portion 122a.

Referring to FIGS. 2 and 3, the first and second electrode plates 121b and 122b have a large quadrangular shape and overlap each other, and the first lead portion 121a and the second lead portion 122a are portions respectively extending from the first and second electrode plates 121b and 122b and disposed to be exposed to an external surface of the ceramic body 110.

The first and second electrode plates 121b and 122b have portions overlapping each other when viewed from the width-length plane of the ceramic body 110.

When currents having different polarities are applied to the first and second internal electrodes 121 and 122, a capacitance forming region is formed in the overlapping portions of the first and second electrode plates 121b and 122b.

The first lead portion 121a and the second lead portion 122a serve to supply current to the first and second electrode plates 121b and 122b.

First end of the first lead portion 121a and the second lead portion 122a are connected to the first and second electrode plates 121b and 122b and second ends thereof are exposed to an external surface of the ceramic body 110.

Current is supplied through the exposed portions of the first lead portion 121a and the second lead portion 122a and current is supplied to the first and second electrode plates 121b and 122b through the first lead portion 121a and the second lead portion 122a.

In general, in the MLCC, the internal electrode may be increased in size to increase the region in which the electrode plates overlap, thereby increasing capacitance.

Here, however, in a case in which the electrode plates are formed up to the edges of the dielectric layers in order to increase the electrode plates of the internal electrodes, the electrode plates may be exposed to an external surface of the ceramic body.

In this case, the electrode plates may be connected to external electrodes or other external electrodes to cause a short circuit.

In particular, the surface of the ceramic body to which the lead portions are exposed is closed to external electrodes and board electrodes of a board on which the MLCC is to be mounted, leading to a high risk of short circuits.

Also, in order to form the ceramic body of the MLCC, the laminate formed by stacking the dielectric layers and the internal electrodes undergoes a cutting process, and here, if a space between the surface to which the lead portions are exposed and the electrode plates is not sufficient, defective cutting may occur due to a difference in strength between the dielectric layers and the lead portions.

Thus, large electrode plates may be employed, while increasing reliability, in forming the MLCC.

In the MLCC 100 according to an exemplary embodiment, capacitance may be maximized by minimizing a space between the first and second electrode plates 121b and 122b and an external surface of the ceramic body 110.

Also, a distance between the surface to which the first and second lead portions 121a and 122a are exposed to an external surface of the ceramic body 110 and the first and the second electrode plates 121b and 122b is disposed may be larger than a distance between the first and the second electrode plates 121b and 122b and other surfaces of the ceramic body 110, thereby preventing the occurrence of a problem such as a short circuit or defective cutting and increasing reliability.

A material used to form the first and second internal electrodes 121 and 122 is not particularly limited, and for example, the first and second internal electrodes 121 and 122 may be formed of a conductive paste including one or more materials among conductive metals such as palladium (Pd), a palladium-silver (Pd—Ag) alloy, and the like, nickel, and copper.

Referring to FIGS. 2 and 3, the first and second internal electrodes 121 and 122 include the first and second rectangular electrode plates 121b and 122b and the first lead portion 121a and the second lead portion 122a formed to extend from the first and second electrode plats 121b and 122b to an external surface of the ceramic body 110, respectively.

The first lead portion 121a and the second lead portion 122a are exposed to one surface of the ceramic body 110. In FIGS. 2 and 3, the first lead portion 121a and the second lead portion 122a are exposed to a lower surface of the ceramic body 110 in the same manner, but the configuration of the first lead portion 121a and the second lead portion 122a is not limited thereto.

For example, the first lead portion 121a may be disposed to be exposed to a lower surface of the ceramic body 110, and the second lead portion 122a may be disposed to be exposed to the first end surface.

Lengths of the first lead portion 121a and the second lead portion 122a extending from the first and second electrode plates 121b and 122b to the surface of the ceramic body 110 to which the first lead portion 121a and the second lead portion 122a are exposed may be defined as Mb.

Referring to FIGS. 2 and 3, a space between the first and second electrode plates 121b and 122b and the lower surface of the ceramic body 110 corresponds to Mb.

Also, a length from the first and second electrode plates 121b and 122b to a surface of the ceramic body 110 opposing the surface of the ceramic body 110 to which the first lead portion 121a and the second lead portion 122a are exposed may be defined as Mt.

Referring to FIG. 2, a space between the first and second electrode plates 121b and 122b and an upper surface of the ceramic body 110 corresponds to Mt. In this case, Mb>Mt is satisfied.

By minimizing Mt as the length from the first and second electrode plates 121b and 122b to a surface of the ceramic body 110 opposing the surface of the ceramic body 110 to which the first lead portion 121a and the second lead portion 122a are exposed, a region in which the first and second electrode plates 121b and 122b are provided may be maximized to obtain an effect of maximizing capacitance.

Also, by increasing Mb as the length of the first lead portion 121a and the second lead portion 122a extending from the first and second electrode plates 121b and 122b to a surface of the ceramic body 110 to which the first lead portion 121a and the second lead portion 122a are exposed such that Mb is greater than Mt, a short-circuit, or the like, may be prevented to obtain an effect of increasing reliability of the MLCC 100.

In the MLCC 100 according to an exemplary embodiment of the present disclosure, when a length from the surface to which the first lead portion 121a and the second lead portion 122a are exposed to an external surface of the ceramic body 110 to the surface of the ceramic body 110 opposing the surface is Ts, a condition of 1.69≤Ts/(Mt+Mb)≤17.75 may be satisfied to increase capacitance and obtain an effect of enhancing reliability.

In FIGS. 2 and 3, Ts is a distance between the lower surface of the ceramic body 110 to the upper surface thereof, which corresponds to a thickness of the ceramic body 110.

The spaces Mt+Mb refer to a margin of the electrode plates in the electric layers 111. As Mt+Mb is reduced, the margin is small and the electrode plates are large, and in this case, capacitance of the MLCC 100 is increased, while reliability thereof is lowered.

In a case in which Ts/(Mt+Mb) has a value smaller than 1.69, capacitance of the MLCC 100 is reduced while a margin thereof is increased, causing a side effect of increasing an ESL value, while reliability is increased. Conversely, as Mt+Mb is greater, the margin is increased and the electrode plates are reduced, and thus, in this case, capacitance is reduced, while reliability of the MLCC 100 is increased.

In a case in which Ts/(Mt+Mb) has a value greater than 17.75, the capacitance of the MLCC 100 is increased, but defective cutting is increased and reliability is lowered.

Thus, by forming the MLCC 100 satisfying the condition of 1.69≤Ts/(Mt+Mb)≤17.75, the effect of increasing capacitance and enhancing reliability may be obtained.

Satisfying a condition of 0.0282≤Mb/Ts≤0.2958, the MLCC 100 according to an exemplary embodiment of the present disclosure may obtain the effect of further increasing capacitance and enhancing reliability.

Mb is a space between the first and second electrode plates 121b and 122b and portions of the external surface of the ceramic body 110 to which the first lead portion 121a and the second lead portion 122a are exposed.

In FIGS. 2 and 3, Mb is a distance between the first and second electrode plates 121b and 122b and the lower surface of the ceramic body 110, and Ts is a distance from the lower surface of the ceramic body 110 to the upper surface thereof.

The space Mb refers to a margin of the electrode plate with respect to the surface to which the lead portions are exposed in the dielectric layer 111.

As Mb is reduced, the margin is smaller and the electrode plates are large, and thus, the reliability of the MLCC 100 is lowered but the capacitance thereof may be increased.

Conversely, as Mb is increased, a margin is increased and the electrode plates are narrowed, increasing the reliability of the MLCC 100 but reducing the capacitance thereof.

In a case in which Mb/Ts has a value smaller than 09.0282, ESL value of the MLCC 100 may be reduced but reliability thereof is lowered, and in a case in which Mb/Ts has a value greater than 0.2958, the reliability of the MLCC 100 is increased but the capacitance thereof is reduced and an ESL value thereof is increased.

Thus, by forming the MLCC 100 to satisfy the condition of 0.0282≤Mb/Ts≤0.2958, an effect of increasing the capacity and enhancing the reliability may be obtained.

In the MLCC 100 according to an exemplary embodiment, the first and second internal electrodes 121 and 122 may be stacked perpendicularly with respect to the surface to which the first lead portion 121a and the second lead portion 122a are exposed to an external surface of the ceramic body 110. The surface of the ceramic body 110 to which the first lead portion 121a and the second lead portion 122a are exposed refers to a length-width plane of the ceramic body 110.

Referring to FIGS. 1A through 3, the first lead portion 121a and the second lead portion 122a are exposed to the lower surface of the ceramic body 110 and connected to the first and second external electrodes 131 and 132.

The lower surface of the ceramic body 110 on which the first and second external electrodes 131 and 132 are disposed is a mounting surface of the MLCC 110. By stacking the first and second internal electrodes 121 and 122 perpendicularly and exposing the first lead portion 121a and the second lead portion 122a to the same surface, an area of the first and second electrode plates 121b and 122b of the first and second internal electrodes 121 and 122 may be maximized to increase the capacity of the MLCC 100.

The first lead portion 121a may be exposed to both ends of the lower surface of the ceramic body 110 in the length direction and connected to the first external electrode 131. The second lead portion 122a may be exposed to a central portion of the lower surface of the ceramic body 110 and connected to the second external electrode 132. Currents having different polarities flow in the first and second electrode plates 121b and 122b of the first and second internal electrodes 121 and 122, forming the capacitance forming region.

As illustrated in FIGS. 1 through 3, when the first and second external electrodes 131 and 132 are disposed on the lower portions of the ceramic body 110 and the first and second internal electrodes 121 and 122 are disposed to be perpendicular to a mounting surface of a printed circuit board (PCB), a current flowing through first and second board electrodes of the PCB may flow directly to the first and second internal electrodes 121 and 122 through the thickness of the first and second external electrodes 131 and 132, and a current path in the MLCC 100 may be reduced to lower ESL.

In contrast, when the internal electrodes are disposed to be parallel to the mounting surface of the PCB, since the external electrodes need to extend to the lateral surface of the ceramic body 110, a current path is lengthened by an amount equal to the length of the extended external electrodes.

Thus, the MLCC 100 including the first and second internal electrodes 121 and 122 disposed to perpendicular with respect to the mounting surface of the PCB may have low ESL, compared with an MLCC including the internal electrodes disposed to be parallel with respect to the mounting surface of the PCB.

Also, even though the stacking number is increased, the width of the ceramic body 110, rather than the thickness thereof, is increased, and thus, since the current path is not increased, an increase in ESL due to the increase in the stacking number may be minimized.

The first and second external electrodes 131 and 132 may be formed of the same conductive material as that of the first and second internal electrodes 121 and 122, but the material of the first and second external electrodes 131 and 132 is not limited thereto, and the first and second external electrodes 131 and 132 may be formed of, for example, copper (Cu), silver (Ag), or nickel (Ni).

The first and second external electrodes 131 and 132 may be formed by applying conductive paste prepared by adding glass frit to the metal powder and subsequently sintering the conductive paste.

Also, as illustrated in FIG. 1B, in order to enhance bonding strength, first and second external electrodes 131' and 132' may extend from the first surface 1 of the ceramic body 110 to portions of the third and fourth surfaces 5 and 6 of the ceramic body 110 in the width direction.

In addition, in order to enhance bonding strength and increase electrical connection when an MLCC 100' is mounted on a board, the first external electrodes 131' may extend from the first surface 1 of the ceramic body 110 to portions of the third and fourth surfaces 3 and 4 of the ceramic body 110.

The MLCC 100 according to another exemplary embodiment includes a ceramic body 110 including dielectric layers 111 and first and second internal electrodes 121 and 122 disposed with the dielectric layers 111 interposed therebetween. Here, in the ceramic body 110, the sides opposing each other in the thickness direction are defined as upper and lower surfaces 1 and 2, the sides opposing each other in the length direction are defined as first and second end surfaces 3 and 4, and the sides opposing each other in the width direction are defined as third and fourth side surfaces 5 and 6.

The first internal electrode 121 includes a first electrode plate 121b and a first lead portion 121a exposed to a lower surface of the ceramic body 110, and the second internal electrode 122 includes a second electrode plate 122b and a second lead portion 122a exposed to a lower surface of the ceramic body 110. When a length from the first and second electrode plates 121b and 122b to a lower surface of the ceramic body 110 is Mb and a length from the first and second electrode plates 121b and 122b to an upper surface of the ceramic body 110 is Mt, Mb>Mt may be satisfied.

Also, when a thickness of the ceramic body 110 is Ts, 1.69≤Ts/(Mt+Mb)≤17.75 and 0.0282≤Mb/Ts≤0.2958 may be satisfied.

Figure 4:
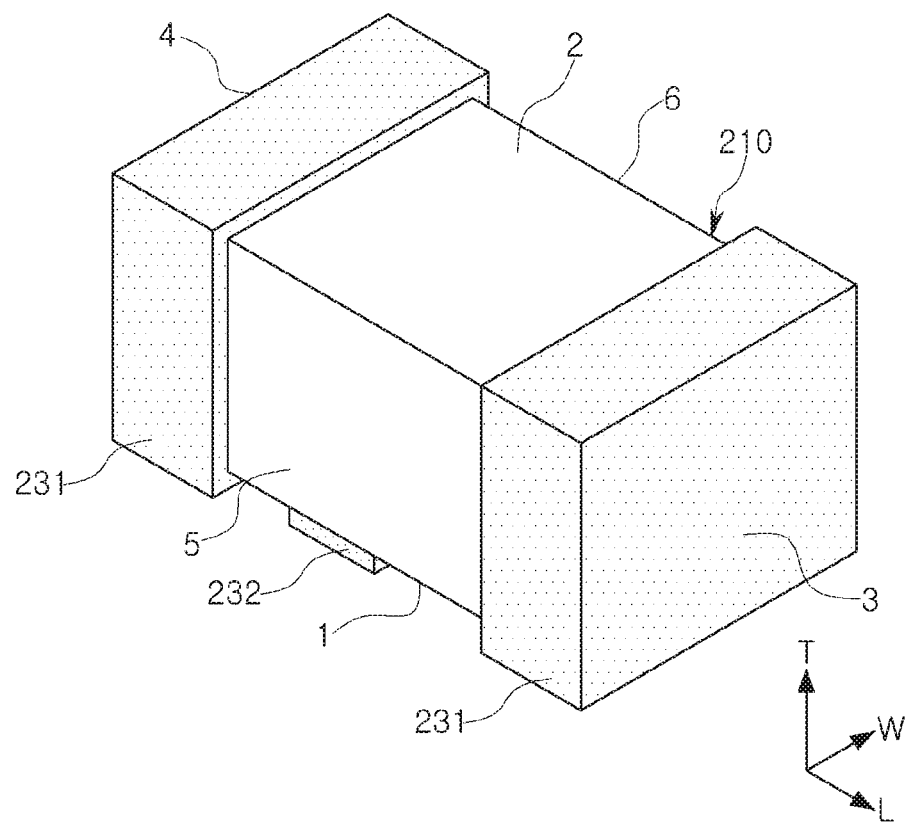
FIG. 4 is a perspective view of an MLCC according to another exemplary embodiment in the present disclosure.
Figure 5:
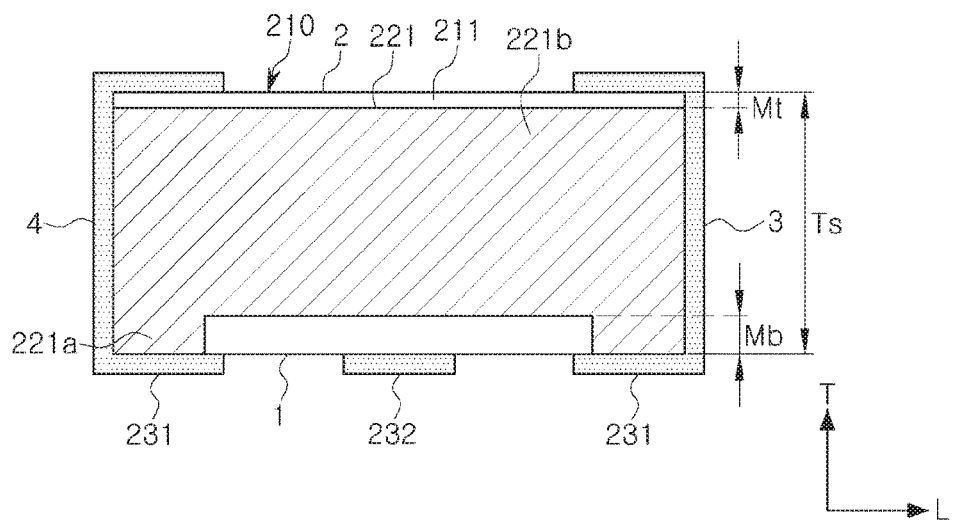
FIG. 5 is a cross-sectional view illustrating a first internal electrode of the MLCC of FIG. 4, taken on a thickness-length plane.
Figure 6:
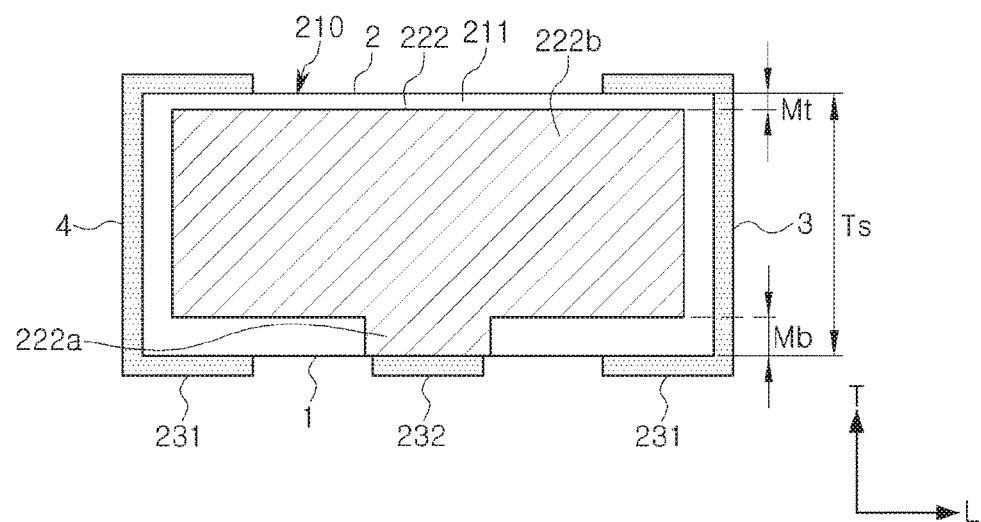
FIG. 6 is a cross-sectional view illustrating a second internal electrode of the MLCC of FIG. 4, taken on a thickness-length plane.

FIGS. 4 through 6 illustrate another exemplary embodiment in the present disclosure.

FIG. 4 is a perspective view of an MLCC 200 according to another exemplary embodiment in the present disclosure, while FIG. 5 is a cross-sectional view illustrating a first internal electrode of the MLCC 200 of FIG. 4, taken on a thickness-length plane, and FIG. 6 is a cross-sectional view illustrating a second internal electrode 222 of the MLCC 200 of FIG. 4, taken on a thickness-length plane.

Referring to FIGS. 4 through 6, in the MLCC 200 according to another exemplary embodiment, a first lead portion 221a is exposed to the lower surface 1 and the first and second end surfaces 3 and 4 of the ceramic body 210.

The first lead portion 221a is positioned at both ends of the ceramic body 210 in the length direction in relation to the thickness-length plane of the ceramic body 210.

The first lead portion 221a may also be exposed to the first and second end surfaces 3 and 4, as well as to the lower surface of the ceramic body 210, so as to be connected to the first external electrode 231.

In this case, the first external electrodes 231 are disposed to extend to the end surfaces of the ceramic body 210 in the length direction.

Since the first external electrodes are extended, an area in which the first internal electrode 221 and the first external electrodes 231 are in contact may be increased, lowering ESR, and since a current path is diversified, ESL may be lowered.

Figure 7:
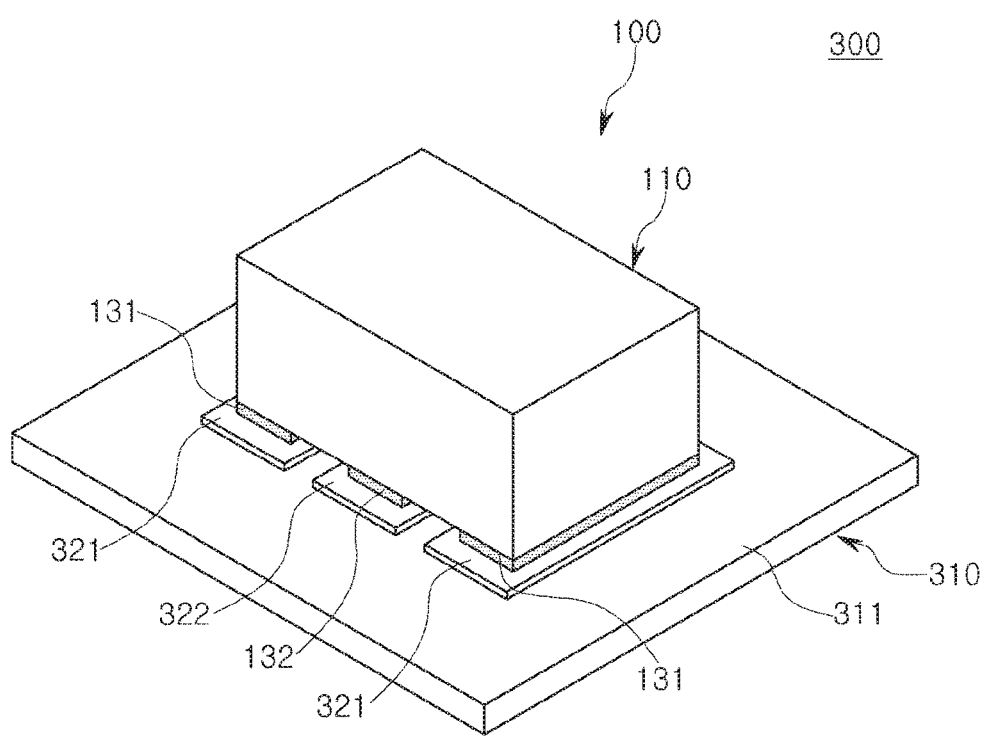
FIG. 7 is a perspective view of a board having an MLCC according to an exemplary embodiment in the present disclosure.

Also, the external electrodes 231 may be stably in contact with first and second board electrodes 321 and 322 of a PCB 310 (please refer to FIG. 7).

Like the MLCC described above, when a length from the first and second electrode plates 221b and 222b to the lower surface of the ceramic body 210 is Mb and a length from the first and second electrode plates 221b and 222b to the upper surface of the ceramic body 210 is Mt, Mb>Mt may be satisfied, and when a thickness of the ceramic body 210 is Ts, a condition of 1.69≤Ts/(Mt+Mb)≤17.75 may be satisfied, thus increasing the capacity and enhancing the reliability. In addition, the MLCC according to the exemplary embodiment may satisfy a condition of 0.0282≤Mb/Ts≤0.2958, thus increasing the capacity and enhancing the reliability.

Board Having Multilayer Ceramic Capacitor

FIG. 7 is a perspective view of a board 300 having an MLCC according to an exemplary embodiment in the present disclosure.

Referring to FIGS. 1 through 3 and 7 described above, the board 300 having an MLCC according to an exemplary embodiment in the present disclosure includes an MLCC 100 including a ceramic body 110 including dielectric layers 111, first and second internal electrodes 121 and 122 disposed with the dielectric layers 111 interposed therebetween, and first and second external electrodes 131 and 132 disposed on external surfaces of the ceramic body 110 and connected to the portions of first lead portion 121a and the second lead portion 122a exposed to an external surface of the ceramic body 110. The first internal electrode 121 includes the first electrode plate 121b and the first lead portion 121a exposed to an external surface of the ceramic body 110, the second internal electrode 122 includes the second electrode plate 122b and the second lead portion 122a exposed to an external surface of the ceramic body 110, and when lengths of the first lead portion 121a and the second lead portion 122a extending from the first and second electrode plates 121b and 122b to a surface of the ceramic body 110 to which the first lead portion 121a and the second lead portion 122a are exposed is Mb and a length from the first and second electrode plates 121b and 122b to a surface of the ceramic body 110 opposing the surface of the ceramic body 110 to which the first lead portion 121a and the second lead portion 122a are exposed is Mt, Mb>Mt is satisfied. Also, the board 300 includes a PCB 310 including first and second board electrodes 321 and 322 respectively connected to the first and second external electrodes 131 and 132.

Like the MLCC 100 described above, in the MLCC 100 included in the board 300 for an MLCC according to an exemplary embodiment of the present disclosure, when a length from the surface to which the first lead portion 121a and the second lead portion 122a are exposed to an external surface of the ceramic body 110 to the surface of the ceramic body 110 opposing the surface is Ts, a condition of 1.69≤Ts/(Mt+Mb)≤17.75 may be satisfied to increase the capacity and enhance the reliability.

Also, satisfying a condition of 0.0282≤Mb/Ts≤0.2958, the MLCC 100 according to an exemplary embodiment of the present disclosure may obtain the effect of further increasing capacity and enhancing reliability.

In the PCB 310, the first and second board electrodes 321 and 322 are disposed on an upper surface of the board 311. The first and second board electrodes 321 and 322 are connected to the first and second external electrodes 131 and 132, respectively.

Currents having different polarities flow to the first and second board electrodes 321 and 322, and flow to the first and second internal electrodes 121 and 122 through the first and second external electrodes 131 and 132, forming capacity.

The first and second board electrodes 321 and 322 and the first and second external electrodes 131 and 132 may be bonded through a reflow process using solder, or may be bonded using a conductive adhesive.

Embodiment

Table 1 shows capacity implementation rate, a defective cut rate, a moisture resistance load NG rate, and ESL according to Ts/(Mb+Mt) and Mb/Ts of an MLCC having a size of 1005. Here, the capacity implementation is a ratio of an actual overlap of internal electrodes with a formation of a margin to an entire overlap on the assumption that a width of a ceramic body is the entire overlap of the internal electrodes, the defective cut rate is a yield (or an acceptance rate) when cut laminates are inspected, and the moisture resistance load NG rate is the number of defective products when a rated voltage is applied with 85% RH (relative humidity).

TABLE

| No | Ts/(Mt + Mb) | Mb/Ts | capacity implementation rate (%) | Cut state | Moisture resistance load NG | ESL [pH] |
|---|---|---|---|---|---|---|
| 1 | 355.00 | 0.0014 | 99.7% | X | 4/400 | 6.0 |
| 2 | 71.00 | 0.0070 | 98.6% | Δ | 2/400 | 16.3 |
| 3 | 35.50 | 0.0141 | 97.2% | ○ | 1/400 | 29.0 |
| 4 | 17.75 | 0.0282 | 94.4% | ⊙ | 0/400 | 32.5 |
| 5 | 11.83 | 0.0423 | 91.5% | ⊙ | 0/400 | 36.0 |
| 6 | 8.88 | 0.0563 | 88.7% | ⊙ | 0/400 | 39.5 |
| 7 | 7.10 | 0.0704 | 85.9% | ⊙ | 0/400 | 43.0 |
| 8 | 5.92 | 0.0845 | 83.1% | ⊙ | 0/400 | 46.5 |
| 9 | 5.07 | 0.0986 | 80.3% | ⊙ | 0/400 | 50.0 |
| 10 | 4.44 | 0.1127 | 77.5% | ⊙ | 0/400 | 53.5 |
| 11 | 3.94 | 0.1268 | 74.6% | ⊙ | 0/400 | 57.0 |
| 12 | 3.55 | 0.1408 | 71.8% | ⊙ | 0/400 | 60.5 |
| 13 | 3.23 | 0.1549 | 69.0% | ⊙ | 0/400 | 64.0 |
| 14 | 2.96 | 0.1690 | 66.2% | ⊙ | 0/400 | 67.5 |
| 15 | 2.73 | 0.1831 | 63.4% | ⊙ | 0/400 | 71.0 |
| 16 | 2.54 | 0.1972 | 60.6% | ⊙ | 0/400 | 74.5 |
| 17 | 2.37 | 0.2113 | 57.7% | ⊙ | 0/400 | 78.0 |
| 18 | 2.22 | 0.2254 | 54.9% | ⊙ | 0/400 | 81.5 |
| 19 | 2.09 | 0.2394 | 52.1% | ⊙ | 0/400 | 85.0 |
| 20 | 1.97 | 0.2535 | 49.3% | ⊙ | 0/400 | 88.5 |
| 21 | 1.87 | 0.2676 | 46.5% | ⊙ | 0/400 | 92.0 |
| 22 | 1.78 | 0.2817 | 43.7% | ⊙ | 0/400 | 95.5 |
| 23 | 1.69 | 0.2958 | 40.8% | ⊙ | 0/400 | 99.0 |
| 24 | 1.61 | 0.3099 | 38.0% | ⊙ | 0/400 | 102.5 |
| 25 | 1.54 | 0.3239 | 35.2% | ⊙ | 0/400 | 106.0 |
| 26 | 1.48 | 0.3380 | 32.4% | ⊙ | 0/400 | 109.5 |
| 27 | 1.42 | 0.3521 | 29.6% | ⊙ | 0/400 | 113.0 |
| 28 | 1.37 | 0.3662 | 26.8% | ⊙ | 0/400 | 116.5 |
| 29 | 1.31 | 0.3803 | 23.9% | ⊙ | 0/400 | 120.0 |
| 30 | 1.27 | 0.3944 | 21.1% | ⊙ | 0/400 | 123.5 |

In the cut state, ⊙ denotes excellent, ○ denotes good, Δ denotes normal, and × denotes bad.

Referring to Table 1, samples 24 to 30 in which Ts/(Mt+Mb) is less than 1.69 and Mb/Ts exceeds 0.2958 have a capacity implementation rate of 40% or less and ESL exceeding 100 pH. Samples 1 to 3 in which Ts/(Mt+Mb) exceeds 17.75 and Mb/Ts is less than 0.0282, have a cut state that is good or lower, and have moisture resistance load that is NG.

Thus, it can be seen that samples 4 to 24 in which $1.69 \cdot Ts/(Mt+Mb) \leq 17.75$ and $0.0282 \leq Mb/Ts \leq 0.2958$ implement products having a high capacity implementation rate and excellent ESL characteristics and excellent cut state without moisture resistance load NG.

As set forth above, the MLCC and the board having the same according to exemplary embodiments of the present disclosure may have low ESL and maximized capacity.

While exemplary embodiments have been shown and described above, it will be apparent to those skilled in the art that modifications and variations could be made without departing from the scope of the present invention as defined by the appended claims.

What is claimed is:

1. A multilayer ceramic capacitor comprising:
    a ceramic body including a dielectric layer and first and second internal electrodes alternately disposed with the dielectric layer interposed therebetween,
    wherein the first internal electrode includes a first electrode plate and a first lead portion exposed to an external surface of the ceramic body and the second internal electrode includes a second electrode plate and a second lead portion exposed to an external surface of the ceramic body,
    wherein Mb>Mt, where Mb is a length of the first and second lead portions extending from the first and second electrode plates to a mounting surface of the ceramic body to which the first and second lead portions are exposed and Mt is a length from the first and second electrode plates to a surface of the ceramic body opposing the mounting surface.

2. The multilayer ceramic capacitor of claim 1, wherein $1.69 \leq Ts/(Mt+Mb) \leq 17.75$, where Ts is a length from the mounting surface of the ceramic body to the surface of the ceramic body opposing the mounting surface of the ceramic body.

3. The multilayer ceramic capacitor of claim 1, wherein $0.0282 \leq Mb/Ts \leq 0.2958$, where Ts is the length from the mounting surface of the ceramic body to the surface of the ceramic body opposing the mounting surface of the ceramic body.

4. The multilayer ceramic capacitor of claim 1, wherein the first and second lead portions are exposed to the same surface of the ceramic body, and the first and second internal electrodes are stacked perpendicularly with respect to the mounting surface of the ceramic body.

5. The multilayer ceramic capacitor of claim 1, further comprising first and second external electrodes disposed on the mounting surface of the ceramic body and electrically connected to the first and second lead portions, respectively.

6. The multilayer ceramic capacitor of claim 5, wherein the first and second external electrodes extend to portions of first and second surfaces in the length direction of the ceramic body.

7. The multilayer ceramic capacitor of claim 5, wherein the first and second external electrodes extend to portions of first and second surfaces in the width direction of the ceramic body.

8. A board having a multilayer ceramic capacitor, the board comprising:
    a multilayer ceramic capacitor including first and second external electrodes and a ceramic body including a dielectric layer and first and second internal electrodes alternately disposed with the dielectric layer interposed therebetween, wherein the first internal electrode includes a first electrode plate and a first lead portion exposed to an external surface of the ceramic body and the second internal electrode includes a second electrode plate and a second lead portion exposed to an external surface of the ceramic body, wherein Mb>Mt where Mb is a length of the first and second lead portions extending from the first and second electrode plates to a mounting surface of the ceramic body to which the first and second lead portions are exposed and Mt is a length from the first and second electrode plates to a surface of the ceramic body opposing the mounting surface of the ceramic body; and a printed circuit board (PCB) including first and second board electrodes connected to the first and second external electrodes, respectively.

9. The board of claim 8, wherein, in the multilayer ceramic capacitor, $1.69 \leq Ts/(Mt+Mb) \leq 17.75$, where Ts is a length from the mounting surface of the ceramic body to the surface of the ceramic body opposing the mounting surface of the ceramic body.

10. The board of claim 8, wherein, in the multilayer ceramic capacitor, $0.0282 \leq Mb/Ts \leq 0.2958$, where Ts is a length from the mounting surface of the ceramic body to the surface of the ceramic body opposing the mounting surface of the ceramic body.

11. The board of claim 8, wherein, in the multilayer ceramic capacitor, the first and second lead portions are exposed to the same surface of the ceramic body, and the first and second internal electrodes are stacked perpendicularly with respect to the mounting surface of the ceramic body.

12. The board of claim 8, wherein the first and second external electrodes are disposed on the mounting surface of the ceramic body, and electrically connected to the first and second lead portions, respectively.

13. The board of claim 8, wherein the first and second external electrodes extend to portions of first and second surfaces in the length direction of the ceramic body.

14. The board of claim 8, wherein the first and second external electrodes extend to portions of first and second surfaces in the width direction of the ceramic body.

15. A multilayer ceramic capacitor comprising:
a ceramic body including a dielectric layer and first and second internal electrodes alternately disposed with the dielectric layer interposed therebetween,
wherein the first internal electrode includes a first electrode plate and a first lead portion exposed to an external surface of the ceramic body and the second internal electrode includes a second electrode plate and a second lead portion exposed to an external surface of the ceramic body,
wherein Mb is not equal to Mt, where Mb is a length of the first and second lead portions extending from the first and second electrode plates to a mounting surface of the ceramic body to which the first and second lead portions are exposed and Mt is a length from the first and second electrode plates to a surface of the ceramic body opposing the mounting surface, and $1.69 \leq Ts/(Mt+Mb) \leq 17.75$, where Ts is a length from the mounting surface of the ceramic body to the surface of the ceramic body opposing the mounting surface of the ceramic body.

16. The multilayer ceramic capacitor of claim 15, wherein $0.0282 \leq Mb/Ts \leq 0.2958$.

17. The multilayer ceramic capacitor of claim 15, wherein the first and second lead portions are exposed to the same surface of the ceramic body, and the first and second internal electrodes are stacked perpendicularly with respect to the mounting surface of the ceramic body.

18. The multilayer ceramic capacitor of claim 15, further comprising first and second external electrodes disposed on the mounting surface of the ceramic body and electrically connected to the first and second lead portions, respectively.

19. The multilayer ceramic capacitor of claim 18, wherein the first and second external electrodes extend to portions of first and second surfaces in the length direction of the ceramic body.

* * * * *